United States Patent
Strobl et al.

(10) Patent No.: US 8,929,038 B2
(45) Date of Patent: Jan. 6, 2015

(54) METHOD AND DEVICE FOR SAFELY SWITCHING A PHOTOVOLTAIC SYSTEM AFTER DIFFERENTIATING THE ARC TYPE

(71) Applicant: Ellenberger & Poesngen GmbH, Altdorf (DE)

(72) Inventors: Christian Strobl, Burgthann (DE); Markus Miklis, Pfeifferhuette (DE)

(73) Assignee: Ellenberger & Poensgen GmbH, Altdorf (DE)

( * ) Notice: Subject to any disclaimer, the term of this patent is extended or adjusted under 35 U.S.C. 154(b) by 52 days.

(21) Appl. No.: 13/778,876

(22) Filed: Feb. 27, 2013

(65) Prior Publication Data
US 2013/0170084 A1   Jul. 4, 2013

Related U.S. Application Data

(63) Continuation of application No. PCT/EP2011/003955, filed on Aug. 6, 2011.

(30) Foreign Application Priority Data

Aug. 31, 2010   (DE) .......................... 10 2010 035 960
Jan. 8, 2011   (DE) .......................... 10 2011 008 140

(51) Int. Cl.
*H02H 3/00* (2006.01)
*H02H 1/00* (2006.01)
*G01R 31/40* (2014.01)
*H02H 7/20* (2006.01)

(52) U.S. Cl.
CPC ........... *H02H 1/0015* (2013.01); *G01R 31/405* (2013.01); *H02H 7/20* (2013.01); *Y02E 10/56* (2013.01)
USPC ......................................................... 361/42

(58) Field of Classification Search
USPC ............................................................ 361/42
See application file for complete search history.

(56) References Cited

U.S. PATENT DOCUMENTS 8,218,274 B2 * 7/2012 Hastings et al. ................ 361/42
8,508,896 B2 * 8/2013 Paoletti et al. .................. 361/67

(Continued)

FOREIGN PATENT DOCUMENTS

| DE | 10 2007 013 712 A1 | 9/2008 |
|----|-----|--------|
| WO | 95/25374 A1 | 9/1995 |
| WO | 2005/098458 A1 | 10/2005 |
| WO | 2011/017721 A1 | 2/2011 |

OTHER PUBLICATIONS

International Search Report of PCT/EP2011/003955, Nov. 2011.

(Continued)

*Primary Examiner* — Ronald W Leja
(74) *Attorney, Agent, or Firm* — Laurence A. Greenberg; Werner H. Stemer; Ralph E. Locher

(57) ABSTRACT

A method and a device for safely switching a direct-voltage system, in particular a photovoltaic system, in the event of an arc occurring on a direct-current side. Wherein the generated direct current and the produced direct voltage are set with regard to power guidance. In the event of a sensor-detected arc, the power guidance is adjusted and a power change of the arc is detected. In the event of a power drop of the arc, a serial or parallel arc is detected according to the adjustment direction of the power guidance. In the event of a serial arc a direct-current interruption is produced, and in the event of a parallel arc a short-circuit current is produced.

10 Claims, 2 Drawing Sheets

(56) References Cited

U.S. PATENT DOCUMENTS

| | | | |
|---|---|---|---|
| 2010/0007332 A1 | 1/2010 | Naumann et al. | |
| 2011/0019444 A1 | 1/2011 | Dargatz et al. | |
| 2011/0141644 A1* | 6/2011 | Hastings et al. | 361/93.2 |
| 2011/0301772 A1* | 12/2011 | Zuercher et al. | 700/293 |
| 2012/0134058 A1 | 5/2012 | Pamer et al. | |

OTHER PUBLICATIONS

Strobl C et al: "Arc Faults in Photovoltaic Systems", Electrical Contacts (HOLM), 2010 Proceedings of the 56th IEEE Holm Conference on, IEEE, Piscataway, NJ, USA, Oct. 4, 2010, pp. 1-7, XP031788250, ISBN: 978-1-4244-8174-3.

* cited by examiner

METHOD AND DEVICE FOR SAFELY SWITCHING A PHOTOVOLTAIC SYSTEM AFTER DIFFERENTIATING THE ARC TYPE

CROSS-REFERENCE TO RELATED APPLICATION

This is a continuation application, under 35 U.S.C. §120, of copending international application No. PCT/EP2011/003955, filed Aug. 6, 2011, which designated the United States; this application also claims the priority, under 35 U.S.C. §119, of German patent application Nos. DE 10 2010 035 960.2, filed Aug. 31, 2010 and DE 10 2011 008 140.2, filed Jan. 8, 2011, the prior applications are herewith incorporated by reference in their entireties.

BACKGROUND OF THE INVENTION

Field of the Invention

The invention relates to a method for safely switching a DC voltage system in the event of an arc occurring on the DC side, in which the direct current generated and the DC voltage produced are adjusted with respect to power management. A DC voltage system is understood as meaning, in particular, a photovoltaic system here.

A DC voltage system of the type mentioned may also be referred to as a low-voltage system for DC voltages up to 1,000 V, for example. Such a system is, for example, a battery system, a system with fuel cells, an electrical system in a motor vehicle, in particular in an electric vehicle or a hybrid vehicle, and a photovoltaic system usually with a number of DC producers.

A photovoltaic system as a DC system usually contains a number of photovoltaic modules (panels) which are connected in series in so-called strings. A plurality of strings may also be connected in parallel, thus forming a photovoltaic generator with a plurality of photovoltaic modules and one or more strings. In this case, the number of modules (panels) within a string in principle determines the DC voltage generated, while the number of strings connected in parallel determines the direct current of the photovoltaic generator.

If the photovoltaic system is used to feed electrical energy converted from solar energy into a public electricity grid, use is usually made of an inverter which converts the direct current produced in the photovoltaic modules into alternating current at an AC frequency adapted to the grid frequency. In the case of an off-grid DC voltage or photovoltaic system, the energy produced can be buffered or can be directly used to supply the load.

The inverter or generally a converter ensures, in conjunction with so-called power management (maximum power point tracker (MPPT)), that the load always operates at or at least in the vicinity of the so-called maximum power point (MMP). The power of the photovoltaic system, which is determined from the product of the DC voltage and the direct current according to the characteristic I/U curve of a photovoltaic system, is zero during idling ($I_{DC}=0$) and in the case of a short circuit ($U_{DC}=0$), that is to say the photovoltaic system does not output any power in these extreme cases. At the MPP, the power output by the solar cells and thus by the photovoltaic modules reaches a maximum. The position of this maximum power point (operating point) is dependent on different factors such as, in particular, the solar radiation, the temperature and ageing phenomena. An MPPT circuit for (maximum) power management sets the direct current and the DC voltage of the photovoltaic generator to the operating point corresponding to the maximum power.

In such a DC system and thus also in a photovoltaic system, arcs may occur at different locations and with different power depending on the system architecture and as a result of aged or damaged line connections or cables and as a result of damaged modules. In order to identify an arc accompanied by a short circuit or current path interruption, international patent disclosure WO 95/25374 discloses the practice of detecting the electromagnetic radiation coming from the arc and of safely switching the circuit section having the short circuit or the current path interruption in order to protect the system.

SUMMARY OF THE INVENTION

It is accordingly an object of the invention to provide a method and a device for safely switching a photovoltaic system after differentiating the arc type which overcome the above-mentioned disadvantages of the prior art methods and devices of this general type, With the foregoing and other objects in view there is provided, in accordance with the invention a method for safely switching a DC voltage system, including a photovoltaic system, in an event of an arc occurring on a DC side, in which a direct current generated and a DC voltage produced are adjusted with respect to power management. The method includes detecting the arc using sensors, adjusting the power management upon detection of the arc, and detecting a power change in the arc. A serial arc or a parallel arc are identified in an event of a power drop in the arc on a basis of an adjustment direction of the power management. A direct current interruption is produced in a case of the serial arc. A short-circuit current is produced in a case of the parallel arc.

In this respect, in the event of an arc detected using sensors, the power management of the system or load is adjusted and a power change in the arc is detected. In the event of a power drop in the arc caused by the power adjustment, a serial or parallel arc is identified on the basis of the adjustment direction of the power management. In this case, a direct current interruption is initiated in the case of a serial arc and a short-circuit current is produced, that is to say a short circuit is deliberately forced, in the case of a parallel arc.

In an expedient refinement, the power management is adjusted in the idling direction, that is to say in the direction of increasing DC voltage, by an adjustment amount and a power change in the arc is detected. This adjustment direction is preferred if at least rough qualification of the type of arc as a serial arc is already possible on the basis of sufficiently meaningful sensor data. Otherwise, if the sensor data classify the arc as a parallel arc with overwhelming probability, the power management or the current/voltage or power/voltage operating point is adjusted in the short-circuiting direction. If a power drop, for example quenching of the arc, is determined as a result of the adjustment of the power management, a serial or a parallel arc is identified depending on the previous power management adjustment direction. Otherwise, that is to say in the event of no power change or a power increase in the arc, the power management is first of all reset by the adjustment amount and is then shifted by an adjustment amount in the respective opposite adjustment direction.

In this case, the invention is based on the knowledge that a DC voltage or photovoltaic system is safely switched in a reliable manner when quenching of the arc is also ensured by the protective measure taken. As is known, in the case of a serial arc, the load or inverter must therefore be isolated from the DC voltage generator and must therefore be switched off in order to interrupt or extinguish the arc. This is because if the load or inverter is disconnected from the DC generator as a result of such an isolating circuit in the case of a parallel arc, only the arc remains as the load, with the result that the entire remaining direct current flows via the arc and accordingly strengthens the latter, rather than extinguishing it.

Therefore, the inverter or the load should be short-circuited on the DC side in the case of a parallel arc. Since, as is known, the majority of possible arcs can now be classified as serial arcs, on the one hand, and parallel arcs, on the other hand, a detected arc should first of all be identified as a serial or parallel arc, which would only be possible with extreme difficulty using sensors or else only with a considerable outlay on sensors.

On the basis of this knowledge, the invention is now based on the consideration that the power behavior of an arc occurring in such a system can first of all be detected in a simple manner using sensors independently of the arc type (serial or parallel), while it is then possible to identify the arc type independently of the sensor by a controlled intervention in the power management. This is because if the operating point, that is to say the power management, is adjusted (detuned) in the idling direction and the arc power drops as a result, a serial arc can be reliably inferred. In a similar manner, when the power management or the operating point is adjusted in a targeted manner and there is a power drop in the arc which is caused thereby and is detected using sensors, a parallel arc can be reliably inferred.

The identification as a serial or parallel arc then forms the control criterion for an isolating switch, for example, in the current path on the DC side or for controlling a short-circuiting switch for the load or for the inverter or converter on the DC side into its closed position. With appropriately configured inverters or converters, these short-circuiting switch and isolating switch functions can also be integrated in the inverter or converter function by corresponding electronic circuit measures.

In this respect, the device contains a controller for power management or for adjusting or setting the operating point of the system. At least one arc sensor which is connected to the controller is connected upstream of a converter on the DC side. Depending on the type of DC system, the converter may be an inverter (DC/AC converter), a DC/DC converter, a charge regulator or the like.

The controller is used to adjust the power management if an arc has been detected using sensors. The controller classifies the arc as a serial or parallel arc using the detected power change in the arc and on the basis of the adjustment direction of the power management. If the arc is classified as a serial arc, the controller isolates the converter on the DC side and, if the arc is classified as a parallel arc, the controller short-circuits the converter on the DC side.

In order to safely switch the system, an isolating switch connected in series upstream of the converter and a short-circuiting switch connected in parallel with the converter are suitably provided, which switches are connected to a control output of the controller. In the case of a serial arc, the controller controls the isolating switch into its open position, while, in the case of a parallel arc, the controller controls the short-circuiting switch into its closed position. The power management or the operating point can be adjusted, in particular in the case of an inverter, by changing the impedance.

Other features which are considered as characteristic for the invention are set forth in the appended claims.

Although the invention is illustrated and described herein as embodied in a method and a device for safely switching a photovoltaic system after differentiating the arc type, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
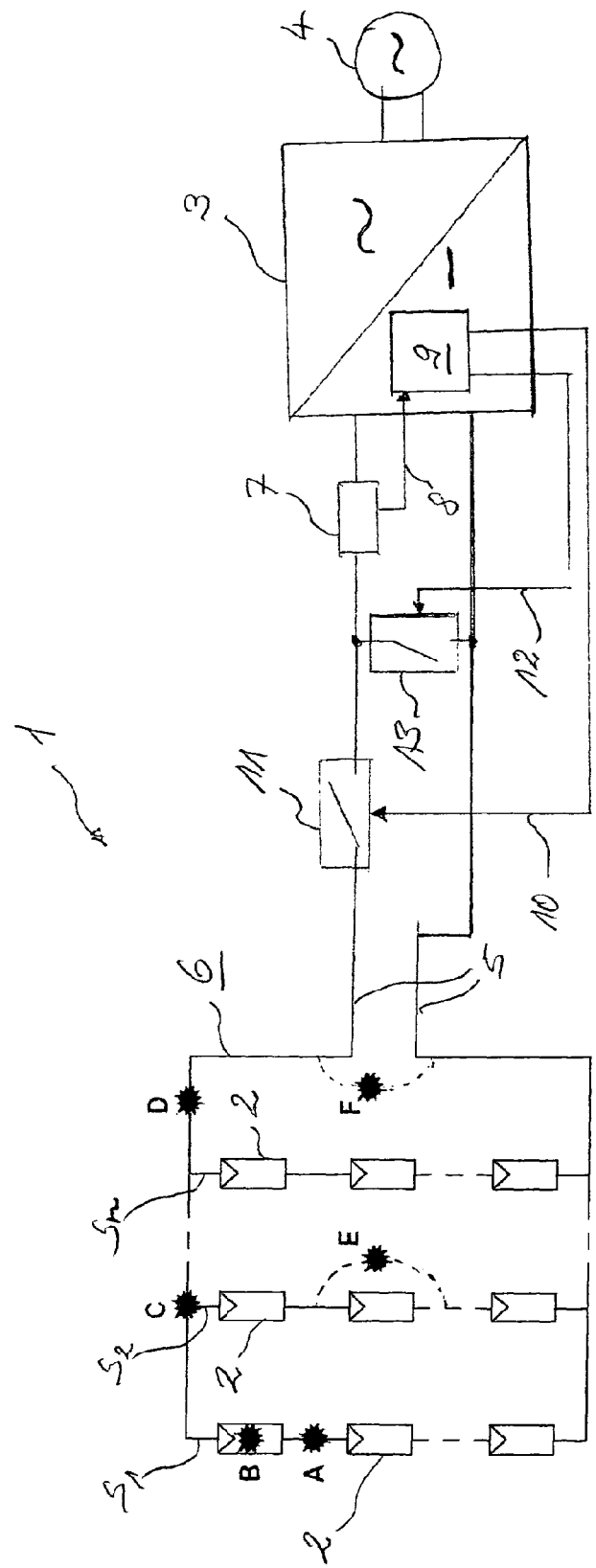
FIG. 1 is a schematic diagram of a photovoltaic system having a number of photovoltaic modules connected in strings and having a sensor on a DC side and having an inverter with a controller on the DC side for power management.

FIG. 1 schematically shows a photovoltaic system 1 having a number of photovoltaic modules 2 which can be provided with bypass diodes and are connected to form a plurality of strings $S_n$. The strings $S_n$ are connected to a common inverter 3 which converts direct current produced by the photovoltaic modules 2 into alternating current and feeds the latter into a public electricity grid 4. On the DC side, an arc sensor 7 is connected, via a supply line 5, between the photovoltaic modules 2, which form a photovoltaic generator 6 and are connected in series or parallel, and the inverter 3. The arc sensor 7 is connected, on an output side, via a signal line 8, to a controller 9 for power management which is assigned to the inverter 3 in the exemplary embodiment. The controller 9 is connected, on the output side, via a first control line 10, to an isolating switch 11 which is connected in series into the supply line 5. The controller 9 is connected, via a second control line 12, to a short-circuiting switch 13 which is connected into the supply line 5 in parallel with the inverter 3 on the DC side.

If an arc occurs inside the photovoltaic system 1, the arc is detected by the sensor 7 and a corresponding sensor signal is transmitted to the controller 9 via the sensor line 8. The sensor 7 may be a sensor for detecting, in particular, steep-edged current changes, as is known from international patent disclosure WO 2005/098458 A1. Such detected fast current changes can be evaluated inside the sensor 7 or else using the controller 9 according to the method known from German patent DE 10 2007 013 712 A1, corresponding to U.S. Pat. No. 7,834,614.

In order to detect an arc, it is possible to also use evaluation of the (analog) sensor signal on the basis of a particular pulse density of instances in which a 1-bit comparator exceeds a threshold value as a result of an arc, in which case a particular pulse density—that is to say a particular number of pulses per unit time—is defined, from which an arc detected using signaling can be assumed. The concept which is already inventive per se involves subjecting an (analog) sensor signal to density evaluation of the digital pulses which can be generated as a result of arcs and producing these in a manner which is favorable in terms of computation time and storage space using a 1-bit comparator instead of complicated pattern recognition devices and multidigit bit arithmetics.

The controller 9 classifies the arc and, depending on the arc type, generates a control signal for isolating the supply line 5. For this purpose, the controller 9 provides, via the control line 10, a corresponding signal for opening the isolating switch 11. Alternatively, the controller 9 generates a control signal that is supplied to the short-circuiting switch 13 via the control line 12 and switches the switch into the closed position 13. Consequently, the inverter 3 is either isolated from the photovoltaic generator by opening the isolating switch 11 or else is short-circuited by closing the short-circuiting switch 13. The type of safe switching depends on whether the arc has been classified as a serial arc or as a parallel arc.

The arcs indicated in FIG. 1 and designated with the capital letters A to D are serial arcs, while the arcs designated with E and F are parallel arcs. A serial arc occurs, for example, inside a string $S_n$ (A), in a photovoltaic module 2 (B), at a string connection (C) or on a collecting line (D) to the inverter 3. A parallel arc may occur with respect to one or more modules 2 (E) or the inverter 3 (F). However, an arc (not illustrated here) may furthermore occur between two strings $S_n$ with a considerably lower degree of probability.

Arc sensors coupled serially in the strings $S_n$ or in the collecting line outside or inside the inverter 3 can also generally not distinguish between serial and parallel arcs using complicated high-frequency sensors. Even with the inclusion of highly sensitive low-frequency current sensors, it is not possible to reliably classify the arc on account of source current and source voltage fluctuations caused by cloud cover since considerable reverse currents from the conventionally provided capacitor of the inverter 3 can be observed in the arc case F, for example during arc ignition. In the arc case E, only small current drops can additionally be ascertained in strings $S_n$ with a large number of modules 2 connected in series. Alternative concepts require a large number of voltage sensors, to be precise, in principle, on each module 2 and on the inverter 3, which sensors must be evaluated in a complicated manner in a central unit.

If, in contrast, a serial arc (A to D) is identified, the arc is extinguished by opening the isolating switch 11 or a string isolator which is possibly provided. In contrast, when a parallel arc (E, F) is identified, the arc at the input of the inverter 3 can be extinguished by a controlled short circuit which is caused by closing the short-circuiting switch 13.

Figure 2:
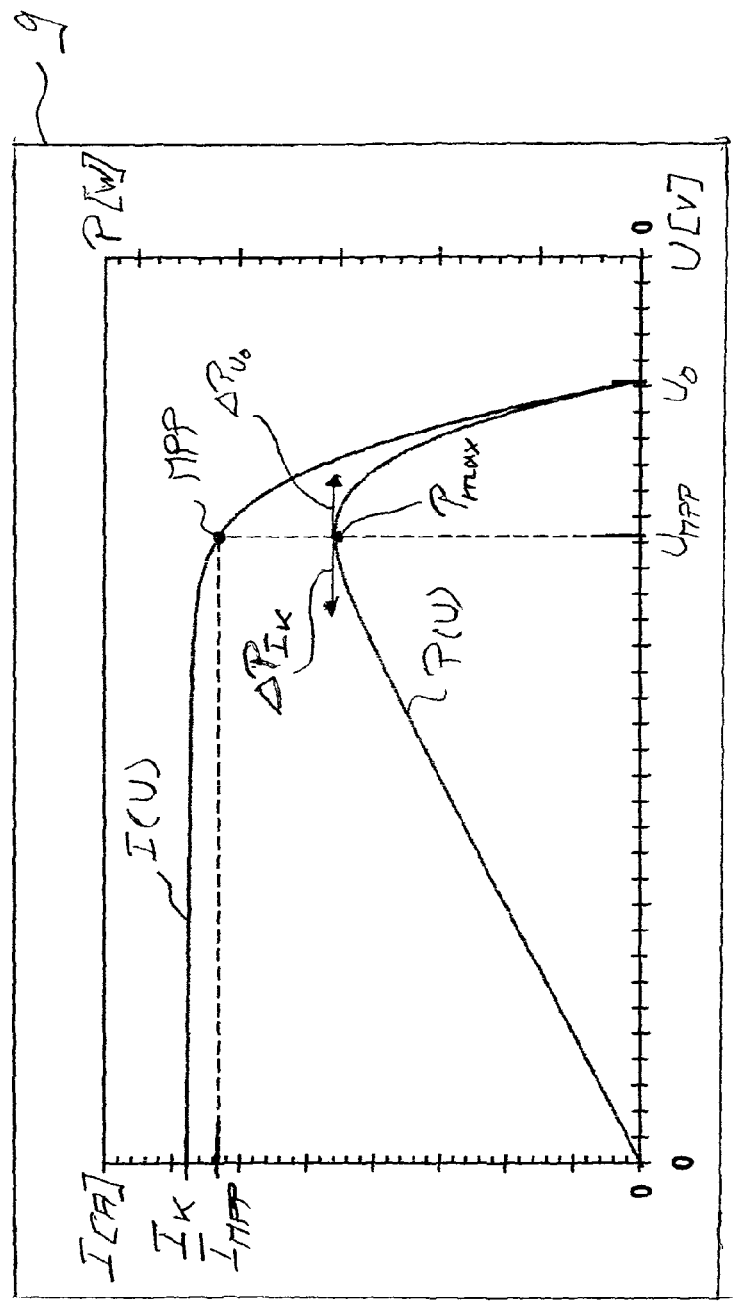
FIG. 2 is a graph showing an I/U and P/U characteristic curve of a controller for power management, which characteristic curve can be adjusted on an arc-specific basis.

In order to classify an arc detected using the sensor 7, the controller 9 is used to influence the power management of the inverter 3 or of the photovoltaic generator 6 in a targeted manner. In this respect, FIG. 2 shows, in the (upper) I/U characteristic curve I(U), the typical current/voltage profile of the photovoltaic generator 6. The (lower) P/U characteristic curve P(U) shows the power profile of the photovoltaic generator 6, which results according to the relationship P=I×U (U=voltage), on the basis of the DC voltage U produced.

It is possible to see that the power P output by the photovoltaic generator 6 is respectively zero (P=0) both during idling $U_0$, in which the generator voltage U is at a maximum and the generator current I is equal to zero, and in the short-circuit case $I_k$ in which the generator voltage U is equal to zero and the short-circuit current $I_k$ flows. The power $P_{max}$ output by the photovoltaic generator 6 reaches a maximum at a particular point which is denoted MPP (maximum power point). The controller 9 for power management, which is also referred to as maximum power point tracking (MPPT), adjusts the power management and thus the operating point as exactly as possible by appropriate control or regulation, with the result that a connected load, the inverter 3 in the present case, always operates at this operating point MPP and thus at maximum power $P_{max}$.

The arc detected using sensors is classified as a serial or parallel arc by the controller 9 by adjusting or detuning the power management and thus the operating point MPP or $P_{max}$ by a particular adjustment amount $\Delta P_{U_0}$, $\Delta P_{I_k}$ in the idling direction $U_0$ or in the short-circuiting direction $I_k$. This adjustment may be effected, for example, by changing the impedance of the inverter 3 in the direction of increased or reduced impedance.

Whether the power management MPP is first of all adjusted in the idling direction $U_0$ or in the short-circuiting direction $I_k$, this can be effected, with a sufficiently sensitive sensor system, according to a degree of probability for a serial or parallel arc which can already be determined using the data from the sensor 7. In this case, the power management is adjusted in the idling direction $U_0$ in a targeted manner, for example in the case of a serial arc which is predetermined with a relatively high degree of probability. As a result, a power drop in the arc is expected. If such a power drop in the arc occurs, a serial arc is reliably identified. Otherwise, if no power change or even a power increase in the arc is sensed, the power management is reset by the adjustment amount $\Delta P_{U_0}$. The power management MPP is then adjusted by the adjustment amount $\Delta P_{I_k}$ in the short-circuiting direction $I_k$. If a power drop in the arc is then detected, a parallel arc is reliably identified and the corresponding safe switching of the system 1 is initiated by virtue of the controller 9 causing the short-circuiting switch 13 to be closed.

If, in contrast, a parallel arc can be classified with a relatively high degree of probability from the sensor signal from the sensor 7, the controller first of all causes the power management MPP to be adjusted by the adjustment amount $\Delta P_{I_k}$ in the short-circuiting direction $I_k$. In this case, the power management is adjusted in the short-circuiting direction $I_k$ in a targeted manner, for example in the case of a parallel arc which is predetermined with a relatively high degree of probability. As a result, a power drop in the arc is again expected. If such a power drop in the arc occurs, a parallel arc is reliably identified. Otherwise, if no power change or even a power increase in the arc is sensed, the power management is reset by the adjustment amount $\Delta P_{I_k}$. The power management MPP is then adjusted by the adjustment amount $\Delta P_{U_0}$ in the idling direction $U_0$. fa power drop in the arc is then detected, a serial arc is reliably identified and the corresponding safe switching of the system 1 is initiated by virtue of the controller 9 causing the isolating switch 11 to be opened.

A corresponding increase or reduction in the impedance of the inverter 3 starting from the current operating point of the inverter 3 in each case is also similar to such adjustment of the power management in the idling or short-circuiting direction.

If a sequence of arcs which burn for a comparatively short time occur instead of arcs which burn for a comparatively long time, for example on account of vibrations, the power analysis or quenching check can be expanded to the sequences of arcs. In this respect, a check is carried out in order to determine whether only low-power arcs occur with the corresponding power adjustments or impedance changes or whether re-ignition of arcs is prevented.

If a plurality of arc sensors are used only in the strings $S_n$ or else in the strings $S_n$ and in the collecting line in a relatively large system 1 and an arc which occurs can also be reliably assigned to a string $S_n$, a string isolator which is possibly present can also be opened instead of the isolating switch 11 when a serial arc is identified. If, however, it is not possible to clearly determine a string or if the arc is detected in the main line or supply line 5, the method according to the invention is carried out, that is to say the power management is adjusted in the idling direction $U_0$ and/or in the short-circuiting direction $I_k$.

The system 1 may generally be a DC voltage system having a DC generator for relatively high DC voltages (approximately 1000 V), which DC generator consists of a number of individual DC producers for example. A converter (DC-DC converter, AC-DC converter, charge regulator or the like) with impedance regulation/control and power management then generally forms the inverter 3.

LIST OF REFERENCE SYMBOLS

1 DC/photovoltaic system
2 Module
3 Inverter/converter
4 Public grid
5 Supply line
6 DC/photovoltaic generator
7 Arc sensor
8 Signal line
9 Controller
10 Control line
11 Isolating switch
12 Control line
13 Short-circuiting switch
A-D Serial arc
E, F Parallel arc
$S_n$ String

The invention claimed is:

1. A method for safely switching a DC voltage system, including a photovoltaic system, in an event of an arc occurring on a DC side, in which a direct current generated and a DC voltage produced are adjusted with respect to power management, which comprises the steps of:
    detecting the arc using sensors;
    adjusting the power management upon detection of the arc;
    detecting a power change in the arc, a serial arc or a parallel arc being identified in an event of a power drop in the arc on a basis of an adjustment direction of the power management; and
    producing a direct current interruption in a case of the serial arc and producing a short-circuit current in a case of the parallel arc.

2. The method according to claim 1, which further comprises adjusting the power management in an idling direction by an adjustment amount and the power change in the arc is detected, the serial arc being identified in an event of a power drop in the arc, and the power management being reset by the adjustment amount in the event of no power change or a power increase in the arc.

3. The method according to claim 2, which further comprises classifying the arc as the parallel arc in an event of no power change or the power increase in the arc.

4. The method according to claim 1, which further comprises adjusting the power management in a short-circuiting direction by an adjustment amount and the power change in the arc is detected, the parallel arc being identified in an event of a power drop in the arc, and the power management being reset by the adjustment amount in the event of no power change or a power increase in the arc.

5. The method according to claim 4, which further comprises classifying the arc as the serial arc in an event of no power change or the power increase in the arc.

6. A device for safely switching a DC voltage system, comprising:
    a converter having a controller for power management and a DC side;
    an arc sensor connected to said controller and connected upstream of said converter on said DC side;
    said power management being adjusted using said controller in an event of an arc being detected using said arc sensor;
    said controller classifying the arc using a detected power change in the arc and on a basis of an adjustment direction of said power management; and
    said controller isolating said converter on the DC side if the arc is classified as a serial arc and short-circuiting said converter on said DC side if the arc is classified as a parallel arc.

7. The device according to claim 6,
    further comprising a short-circuiting switch;
    further comprising an isolating switch; and
    wherein said controller has has an output side connected to said isolating switch connected in series upstream of said converter and to said short-circuiting switch connected in parallel with said converter, said controller controlling said isolating switch into an open position in a case of the serial arc and controlling said short-circuiting switch into a closed position in a case of the parallel arc.

8. The device according to claim 6, wherein an impedance of said converter is changed for adjusting said power management.

9. The device according to claim 6, wherein said converter is selected from the group consisting of an inverter, a DC-DC converter and a charge regulator.

10. A photovoltaic system, comprising:
    a device for safely switching the photovoltaic system, said device including:
        a converter having a controller for power management and a DC side;
        an arc sensor connected to said controller and connected upstream of said converter on said DC side;
        said power management being adjusted using said controller in an event of an arc being detected using said arc sensor;
        said controller classifying the arc using a detected power change in the arc and on a basis of an adjustment direction of said power management; and
        said controller isolating said converter on the DC side if the arc is classified as a serial arc and short-circuiting said converter on said DC side if the arc is classified as a parallel arc.

* * * * *